United States Patent [19]

Springer et al.

[11] 3,716,296

[45] Feb. 13, 1973

[54] METHOD AND ELECTRONIC CIRCUIT ARRANGEMENT FOR PRODUCING PHOTOMASKS

[75] Inventors: Reinhard Springer; Kurt Drescher; Eberhard Jahn, all of Dresden, Germany

[73] Assignee: Arbeitsstelle Fur Molekularelektronik, Dresden, Germany

[22] Filed: May 6, 1970

[21] Appl. No.: 34,961

[52] U.S. Cl. ....................... 355/53, 328/206, 355/77, 355/86, 355/95

[51] Int. Cl. ............................................ G03b 27/42

[58] Field of Search ................ 355/53, 77, 86, 95, 79; 328/206

[56] References Cited

UNITED STATES PATENTS

| | | | |
|---|---|---|---|
| 3,211,072 | 10/1965 | Jonker | 355/79 |
| 3,264,106 | 8/1966 | Alldis | 355/79 |
| 3,539,256 | 11/1970 | Ables | 355/53 |

FOREIGN PATENTS OR APPLICATIONS

| | | | |
|---|---|---|---|
| 1,192,050 | 4/1965 | Germany | 355/53 |

*Primary Examiner*—Samuel S. Matthews
*Assistant Examiner*—Richard A. Wintercorn
*Attorney*—Nolte and Nolte

[57] ABSTRACT

A method and electronic circuit arrangement for producing photomasks comprising repetitive patterns of any desired size regardless of the size of the image field of an optical projection system. According to the present method an orthogonal mask field is displaced to initial coordinates Xi, Yi relative to a fixed column and row coordinate system, a plurality of such mask fields, each having different repetitive patterns, are arranged on a photographic plate displaced relative to each other, such mask fields are then assembled into a complex pattern mask field. The present circuit arrangement comprises control signal generating means for controlling a tool such as an optical projection system as well as positioning means for said tool or for said photographic plate. The signal generating means include a spacing counter connected to preselector units adjustable for selecting said initial coordinates, said units being connected to logic circuit channels which identify the signals produced at the outputs of said preselector units to provide control signals for the optical projection system and for the positioning means.

6 Claims, 7 Drawing Figures

REINHARD SPRINGER
KURT DRESCHER
EBERHARD JAHN
INVENTORS

BY
Nolte & Nolte
ATTORNEYS

REINHARD SPRINGER
KURT DRESCHER
EBERHARD JAHN
INVENTORS

BY Nolte & Nolte
ATTORNEYS

PATENTED FEB 13 1973 3,716,296

SHEET 3 OF 4

REINHARD SPRINGER
KURT DRESCHER
EBERHARD JAHN
INVENTORS

BY *Nolte & Nolte*
ATTORNEYS

REINHARD SPRINGER
KURT DRESCHER
EBERHARD JAHN
INVENTORS

BY Nolte & Nolte
ATTORNEYS

METHOD AND ELECTRONIC CIRCUIT ARRANGEMENT FOR PRODUCING PHOTOMASKS

BACKGROUND OF THE INVENTION

This invention relates to method and electronic circuit arrangement for producing photomasks. Generally the invention will be used in the production of photomasks for the semiconductor and microelectronics technology. More particularly, the present method and circuit arrangement relate to equipment for the production of photomasks by the step-and-repeat principle employing known photorepeaters. In a photorepeater, a wholly automatic or a semi-automatic positioning operation as well as a comb-like positioning motion are carried out.

The integrated circuit design is characterized on the one hand by a steady trend toward even smaller circuit elements and on the other hand by an ever increasing function integration. Therefore, and for attaining a high image quality, the optical projection systems must have maximum resolutions as well as large image fields. These requirements are contradictory to each other because, as known, a high resolution, a high contrast and small image defects restrict the usable image field of optical image projecting systems.

Therefore, in the operation of all types of known photorepeaters a compromise must be made between the minimum size of the circuit elements and the maximum size of the repetitive patterns, i.e., between the resolution or image quality, respectively, and the size of the image field. At the present state of the art, the minimum size of circuit elements, which is determined by the optical limits of resolution of the light-optical imaging systems, has already been reached. Consequently, any further rise in the degree of integration would be possible only by increasing the size of the image field. However, there are stringent limitations imposed on the size of the image field by the properties of the commercially available optical projection systems.

OBJECTS OF THE INVENTION

In view of the above, it is the primary object of this invention to avoid the above mentioned drawbacks and to supplement known wholly automatic or semi-automatic photorepeaters so that substantially larger patterns which are arranged in rows and in columns within a mask field, hereinafter referred to as repetitive patterns, may be produced.

It is yet another object to use said repetitive patterns in any desired size without losses in the maximum resolution achievable by the used projection system, and without any increase in image defects.

A still further object of the invention is to provide a higher degree of internal integration of solid state integrated circuits than would be possible by utilizing merely the limited image field of the optical projection systems, while taking full advantage of the image projecting properties of such commercially available light-optical systems.

It is also an object of this invention to produce photomasks which are made up of repetitive patterns of any desired outer dimensions and which have image definitions corresponding to the maximum resolution achievable by light-optical image projecting methods.

Yet another object of the present invention is to provide an electronic circuit arrangement for producing photomasks having the foregoing qualities.

A still further object of the invention is to maximize the use of the available area on the photographic plate by avoiding unused marginal areas.

It is also an object of the invention to enable the use of intermediate negatives having outer dimensions larger than the image field of the available projection system.

SUMMARY OF THE INVENTION

In accordance with this invention the above objects have been achieved by the definite preselection of the coordinate values $X_i$ and $Y_i$, hereinafter referred to as initial coordinates, of the first repetitive pattern of a plurality of repetitive patterns which are arranged in rows and columns forming a raster within a photomask field. A prerequisite for the realization of this invention is that the positioning device of the photorepeater to be used, must have a precisely fixed reference point which can reproducibly be adjusted and serves, for all positioning cycles, as origin of the coordinate system. This reference point must remain fixed, at least during the total time required to produce a complete photomask, with such an accuracy of location as is required for the positioning accuracy for generating all repetitive patterns included in the mask field.

There are various applications of the method of this invention. A photomask which comprises large-size repetitive patterns so called non-uniform or inhomogeneous complex patterns made up of a number of differing individual patterns which are self-contained or complete as to their functional content, is produced by successively performing a number of step-and-repeat cycles using, said number of cycles corresponding to the number of individual patterns with different initial coordinates $X_i$ and $Y_i$.

The different coordinate pairs $X_i$, $Y_i$ define the relative positions of the differing individual patterns within the non-uniform complex repetitive patterns. Before each of the step-and-repeat cycles is started, the intermediate negative is exchanged and the respective initial coordinates $X_i$ and $Y_i$ are preselected. Proceeding in this way, all differing individual patterns are placed into positions relative to each other in accordance with suitably selected pairs of coordinate values, whereby they are assembled into complex repetitive patterns.

This invention is also applicable to producing photomasks comprising large-size repetitive patterns or so called uniform or homogeneous complex patterns, made up of differing sub-patterns which are incomplete as to their functional content. Such mask is produced in much the same manner as a photomask comprising non-uniform or inhomogeneous complex patterns, i.e. by performing successive step-and-repeat cycles whereby the intermediate negatives are exchanged after each cycle and different initial coordinates are adjusted or selected for each cycle. This method is to be used when the size of a uniform or homogeneous complex pattern is so large that it cannot be imaged by the projection system. In this case the uniform, complex, repetitive pattern is subdivided into a suitable number of sub-patterns each represented by an intermediate negative and each having dimensions which are compatible with the image field of the projection system. The partition lines for subdividing the uniform complex pattern are placed so that the circuit elements of the solid state integrated circuit are not cut or, if necessary are cut only at non-critical points. If all the successive step-and-repeat cycles for recombining or assembling the sub-patterns are carried out with an accuracy corresponding to the positional accuracy and marginal definition of the circuit elements then the resolution of the projection system will be fully utilized for all the regions of the composite uniform complex pattern. For this re-assembling process the required intermediate negatives must be placed, in a known manner, into alignment frames and aligned by using an adjustment mark.

In accordance with this invention it will further be possible to shift the mask field, that is, the field of the photographic plate covered by repetitive patterns, in any desired direction over the photographic plate by definitely presetting of the initial coordinates. For example, this is important for the production of photomasks which comprise very small sized repetitive patterns. In order to fully utilize, in this case, the image field of the projection system and to minimize the total time required for producing a complete photomask as well as the electrical load of the electronic flash-tubes of the photorepeater, it is necessary that the intermediate negative is made up of several identical repetitive patterns, rather than only one repetitive pattern, which are arranged in a gridlike array or raster with appropriate spacing. This intermediate or second negative can also be produced by the photorepeater by first making a first intermediate negative having only one repetitive pattern in a known manner. Using this first intermediate negative, a photomask is produced by the photorepeater which serves as the second intermediate negative during the subsequent step-and-repeat operation for the production of the final or master photomask. The mask field required for the second intermediate negative has usually relatively small outer dimensions and must be located symmetrically with respect to the center of the photographic plate.

A maximum exploitation of the usable area of the photographic plates is particularly important when relatively large sized repetitive patterns are to be imaged, for example by means of projection systems having only a small image scale. When using known photorepeaters, the first pattern row is arranged with a distance $\Delta Y$ and the first pattern column is arranged with a distance $\Delta X$ from the reference point of a tool or work piece positioning device. As a result, pattern free marginal regions appear on the photographic plate the width of which, in each case, is equal at least to one half of the total diameter of the repetitive pattern.

In accordance with this invention this loss of usable area of the photographic plate, which increases with increasing size of the repetitive pattern, has been completely avoided by an appropriate preselection of the initial coordinates $Y_i$ and $X_i$.

In order to enable the production of large-size repetitive patterns by assembling individual patterns or sub-patterns, it is necessary to provide a preselection of the coordinates of the first repetitive pattern independently of the spacings between rows and columns. Known photorepeaters, in which the positioning device automatically performs a comb-like motion whereby the positioning process is based on the counting of output signals from incremental measurement systems, are provided with preselection counters which are adjusted to the row and column spacings. Hereinafter said preselection counters are referred to as spacing counters. Even the position of the first repetitive pattern is thus fixed by the preselected row and column spacings.

In accordance with this invention, the electronic circuit arrangement for the independent preselection of the coordinates $X_i$ and $Y_i$ of the first repetitive pattern comprises in addition to the column and row spacing preselector units two further preselector units, one for preselecting the coordinate $X_i$ and the other for preselecting the coordinate $Y_i$, which are connected to spacing counter means. All preselector units are interconnected by basic logic circuits and memory units in such a way that during the motion cycle of the positioning device the location of the first row is fixed by the preselected coordinate $Y_i$ and the location of the first column, i.e., the location of the first repetitive pattern of each row, is fixed by the preselected coordinate $X_i$ of the first repetitive pattern, whereas all other row and column spacings are fixed by the row and column spacings preselected at the row and column spacing preselector units. If the preselected row and column spacings are the same for several successive step-and-repeat cycles, if different initial coordinates $X_i$ and $Y_i$ are preselected prior to each cycle, and if the intermediate negatives are exchanged, then several different mask fields are produced which are displaced relative to each other but which have the same raster dimensions. With the preselection of suitable coordinates $X_i$ and $Y_i$ these different mask fields are assembled into single mask field the repetitive patterns of which represent uniform or non-uniform complex patterns.

It is an advantage of this invention that it extends the range of use of known photorepeaters inasmuch as it makes possible by the definite preselection of the initial coordinates $X_i$ and $Y_i$ for each mask field, to assemble automatically or semi-automatically complex patterns of any desired size from individual patterns or sub-patterns and further to arrange mask fields in any location displaced relative to the outlines of the photographic plate. Since the positioning accuracy of photorepeaters in modern practice is comparable to the maximum resolution of light-optical image projecting systems, this invention makes it possible to use commercially available projection systems for producing on photographic plates repetitive patterns of any desired size with the best image quality.

In order that the invention may be clearly understood, it will now be described, by way of example, with reference to the accompanying drawings, wherein.

Figure 1:
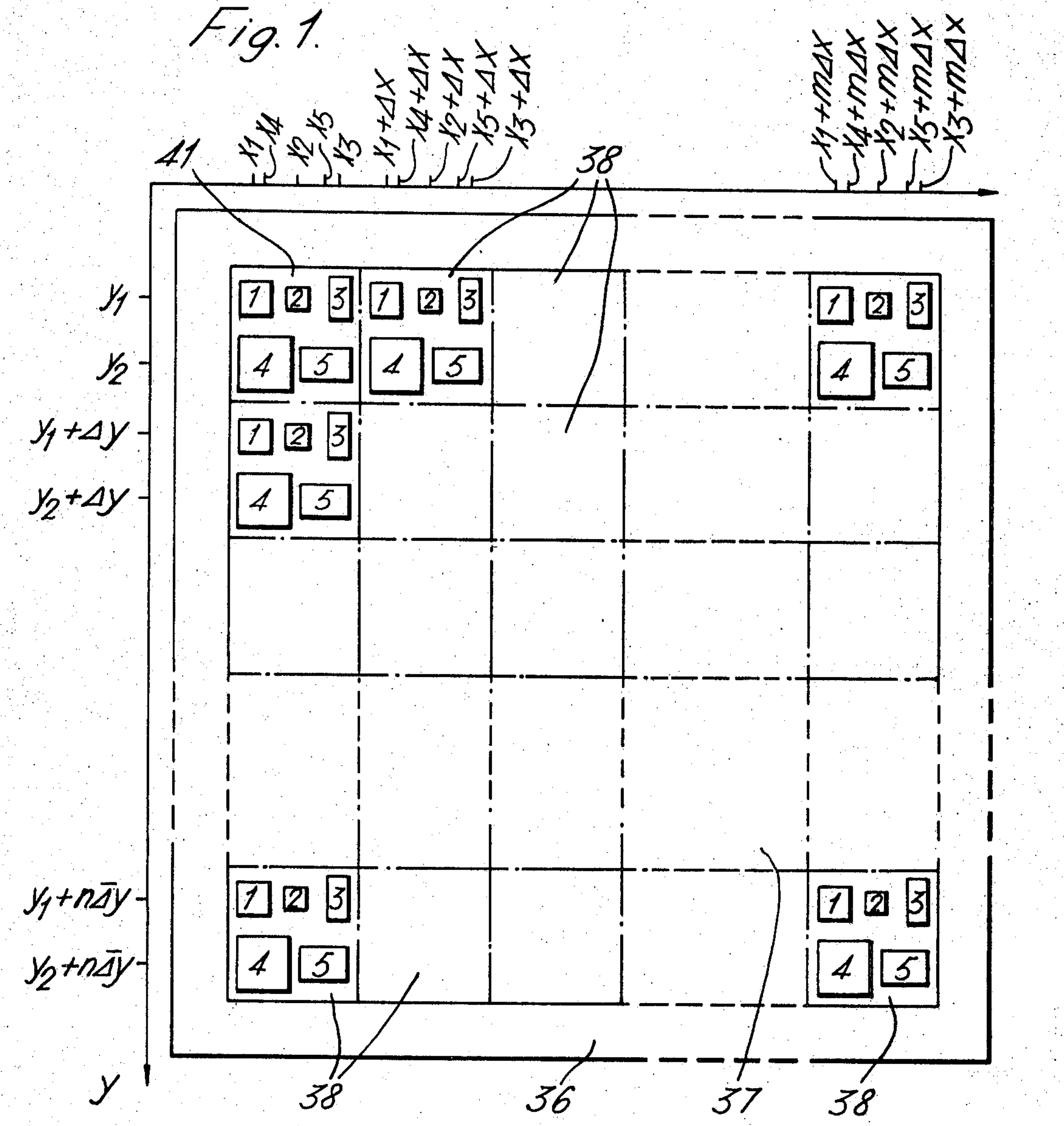
FIG. 1 is a schematic diagram of a photomask which comprises inhomogeneous or non-uniform complex patterns built up of five individual patterns.

In order to produce a photomask made up of inhomogeneous or non-uniform complex patterns 38, which, according to FIG. 1, for example are composed of five individual patterns, the step-and-repeat cycle is performed five times in succession. During each cycle one of the individual patterns 1 to 5 is projected onto the photographic plate 36. Before starting each of the five step-and-repeat cycles, the corresponding initial coordinates $X_i$ and $Y_i$, i.e., for example, the values ($X_1$, $Y_1$), ($X_2$, $Y_1$), ($X_3$, $Y_1$), ($X_4$), ($X_4$, $Y_2$) and ($X_5$, $Y_2$), are preselected at the preselection units. The preselected values of the row spacing $\Delta Y$ and column spacing $\Delta X$ remain unchanged during all step-and-repeat cycles.

Figure 2:
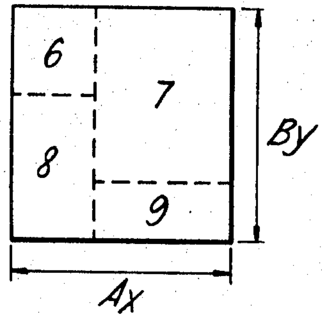
FIG. 2 is a schematic diagram of a homogeneous or uniform complex pattern which is, for reasons of its large size, partitioned into four sub-patterns.
Figure 3:
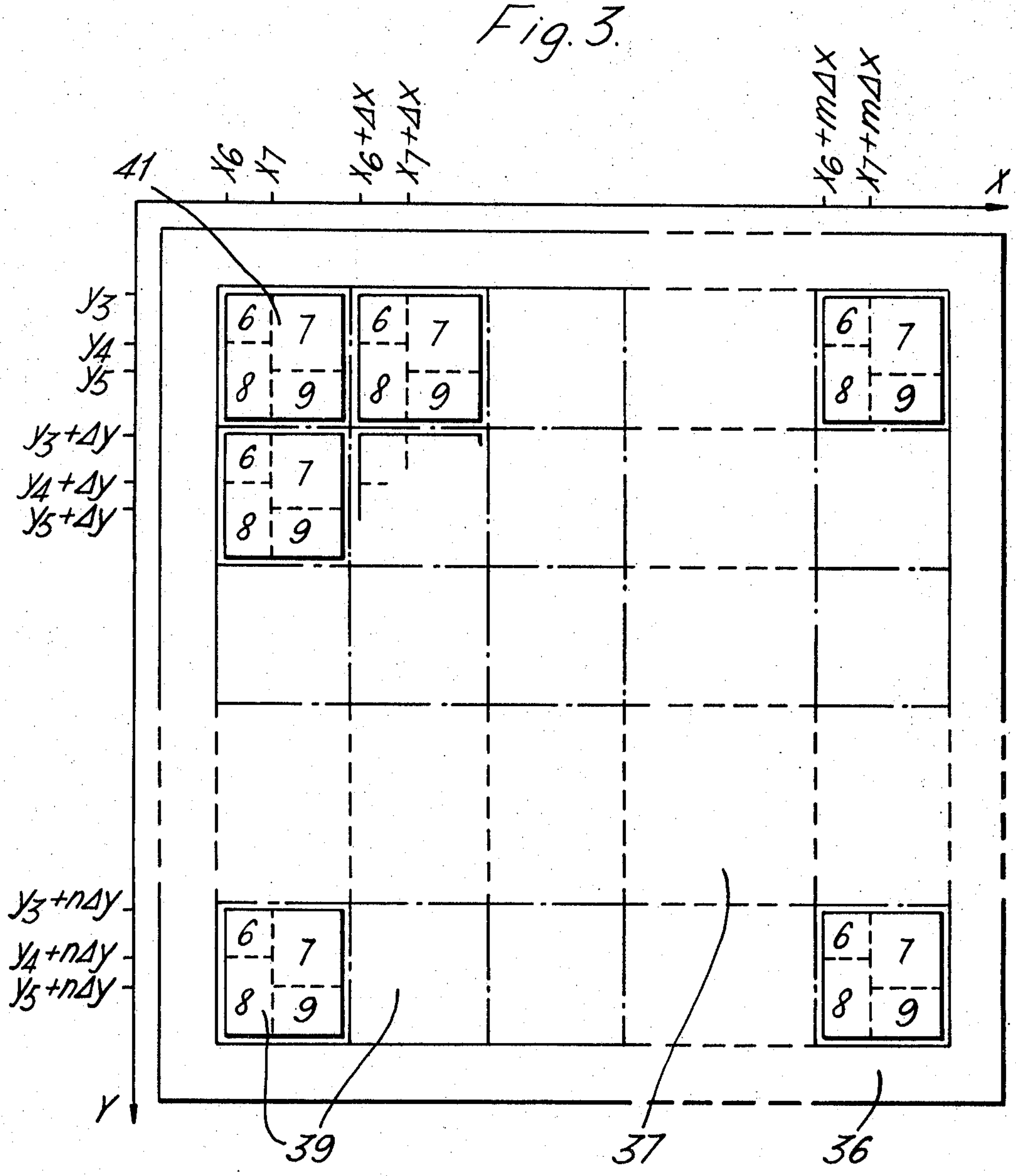
FIG. 3 is a schematic diagram of a photomask which comprises homogeneous or uniform complex patterns built up of four sub-patterns.

If it is desired to produce a master photomask by means of an intermediate negative of the kind shown in FIG. 2 the dimensions $A_X$ and $B_Y$ of which are larger than those of the image field of the used projection system, the specific intermediate negative is divided, for example, into four sub-patterns 6 to 9. The dividing lines are placed so that circuit elements are either not cut or are cut only at non-critical points. The only requirement to be met in this connection is to assure an unrestricted imaging of each sub-pattern. Stated differently, the size of any sub-pattern must not exceed the size of the image field. The intermediate negatives of the different sub-patterns are placed in a known manner into alignment frames to assure their definite position with respect to the optical axis of the projection system. For the purpose of alignment the intermediate negatives are provided with adjustment marks. In order to re-assemble the sub-patterns 6, 7, 8, 9 into uniform complex patterns 39 on the photographic plate 36, four successive step-and-repeat cycles are required. During the first cycle the intermediate negative or sub-pattern 6 and the preselected initial coordinates $X_6$ and $Y_3$ are used. Before starting the second cycle, the intermediate size master of sub-pattern 7 is placed into the alignment frame and the initial coordinates $X_7$ and $Y_3$ are preselected. Proceeding similarly for the remaining sub-patterns, all sub-patterns are projected in their predetermined positions onto the photographic plate. As can be seen from FIG. 3, the preselected row and column spacings remain unchanged during all step-and-repeat cycles. The differences of the initial coordinates, $X_7 - X_6$, $Y_4 - Y_3$ and $Y_5 - Y_3$, are calculated from the dimensions of the corresponding sub-patterns.

Figure 4:
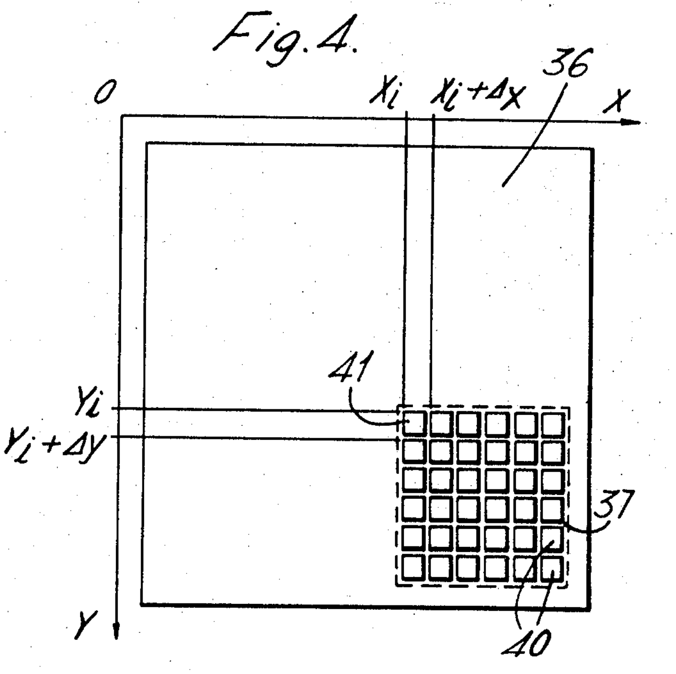
FIG. 4 is a schematic diagram showing the displacement of the field of a photomask on a photographic plate.

FIG. 4 shows a mask field 37 with repetitive patterns 40 the total area of which is considerably smaller than the usable area of the photographic plate 36. By an appropriate preselection of the initial coordinates $X_i$ and $Y_i$ of the first repetitive pattern 41 the mask field can arbitrarily be located on the photographic plate with respect to the outlines or margins of the photographic plates.

Figure 5A:
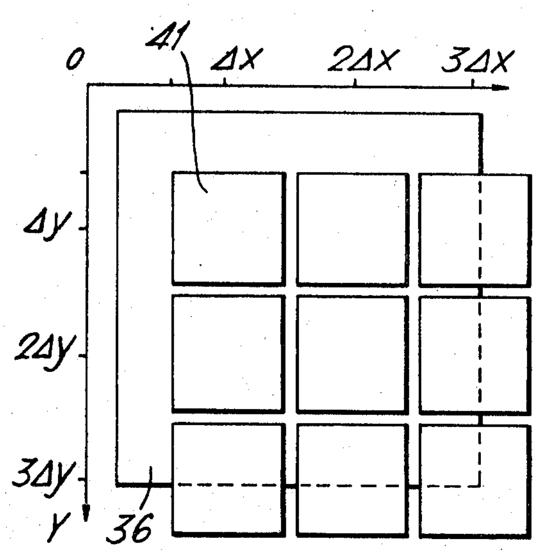
FIGS. 5a and 5b illustrate in schematic diagrams the way in which large-size repetitive patterns are to be arranged in order to optimally utilize the area of the photographic plate.
Figure 5B:
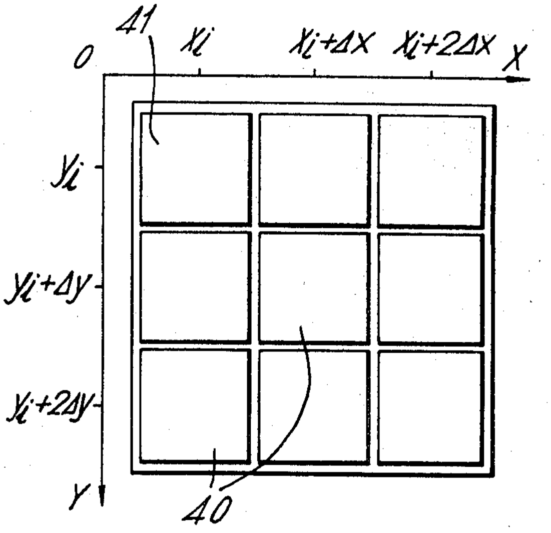

FIG. 5b shows another advantage of photorepeaters permitting, in accordance with this invention, preselected initial coordinates $X_i$ and $Y_i$ as compared to known photorepeaters wherein the first repetitive pattern 41 is fixed by the spacings between the rows and columns as shown in FIG. $5_a$. This advantage is especially evident in case of a photomask having very large repetitive patterns 40. An optimum utilization of the area of the photographic plate 36 can be achieved as shown in FIG. 5b for any size of the repetitive patterns 40 by fixing the location of the first repetitive pattern 41 independently of the row and column spacings by an appropriate preselection of the initial coordinates $X_i$ and $Y_i$.

Figure 6:
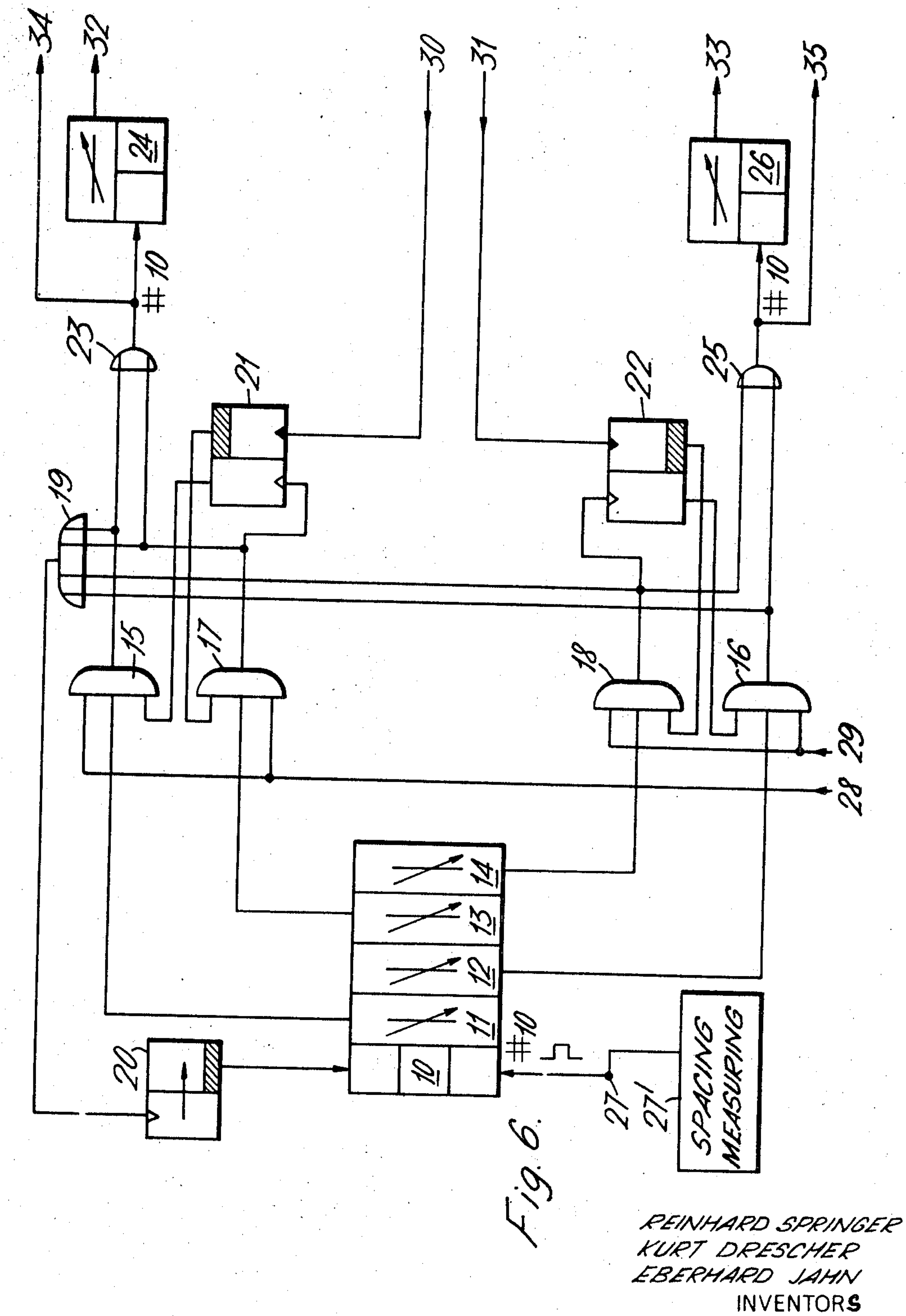
FIG. 6 is a circuit diagram of the electronic circuit arrangement of this invention for fixing the initial coordinates $X_i$ and $Y_i$ of the mask field.

FIG. 6 shows the electronic circuit arrangement of this invention used for fixing the initial coordinates $X_i$ and $Y_i$ of the mask field. The signals from a known incremental length or spacing measuring device 27' are fed through input 27 to a spacing counter 10. Because the path of travel of the positioning device of photorepeaters has a comb shape, the travel in the X-direction and the travel in the Y-direction of the step-and-repeat cycle never occur simultaneously. Therefore, the spacing counter 10 can be used for measuring both the row spacing $\Delta Y$ and the column spacing $\Delta X$. The row spacing is preselected by a preselector unit 12 connected to the spacing counter 10 and followed by an AND-gate 16. The column spacing is preselected by a preselector unit 11 connected to the spacing counter 10 and followed by an AND-gate 15. As soon as one of the preselected digits in the preselector units is reached by the count of the counter 10 a signal is produced by the AND-gates 15 or 16, respectively.

In addition, a preselector unit 14 with an AND-gate 18 for preselecting the initial coordinate $Y_i$ as well as a preselector unit 13 with an AND-gate 17 for preselecting the initial coordinate $X_i$ are connected to the spacing counter 10. The outputs of the AND-gates 17 and 18 are each connected to a respective flip-flop or bistable multivibrator 21 and 22. At the beginning of the operating cycle these flip-flops are in the stable states as shown in FIG. 6, in the following designated as original states. When both flip-flops 21, 22 are in the original states, the AND-gates 15 and 16, respectively, connected to the spacing preselector units 11 and 12, are disabled and the AND-gates 17 and 18 are enabled. In addition, the AND-gates 15 and 17 are connected through the conditioning input 28 and the AND-gates 16 and 18 are connected through the conditioning input 29 to the control unit of the positioning device which is not shown in FIG. 6 since the positioning device and the control unit are not part of the invention. The output signals of the AND-gates 15 and 17 are combined by an OR-gate 23 and then fed to a column counter 24. Similarly, the output signals of the AND-gates 16 and 18 are fed through an OR-gate 25 into a row counter 26. The signals for the control of the step-and-repeat cycles are taken from output 32 of the column counter 24 and from output 33 of the row counter 26 and fed to the control unit of the positioning device. Furthermore, the output signals of the AND-gates 15 to 18 are combined by an OR-gate 19 and then fed to the input of a monostable multivibrator 20 which serves to reset the spacing counter 10 to zero.

The usual comb-like positioning motion for the production of a photomask starts in the Y-direction (direction of columns). In this case, the AND-gates 15 and 17 provided for preselecting the motion in the X-direction are disabled by a logic zero or "0" signal supplied to the conditioning input 28 by the control unit and the AND-gates 16 and 18 for preselecting the motion in the Y-direction are enabled by a logic one or "1" signal supplied to input 29 by the control unit. In addition, the AND-gates 15 and 16 are disabled by the static output signals of the flip-flops which, at this point, are in the original states, whereas the AND-gates 17 and 18 would be enabled. However, since in view of the foregoing the AND-gates 15, 16 and 17 are disabled, a preselection signal can arise only at the output of the AND-gate 18, when the coordinate value $Y_i$ as preselected by the preselector unit 14 is reached. This signal is fed through the OR-gate 25 into the row counter 26 and the first row is counted. The flip-flop 22 is changed into its opposite state, in the following designated as operating state, and, as a result, the AND-gate 16 is enabled and the AND-gate 18 is disabled. Through output 35 is signal is fed into the control unit of the positioning device not shown in FIG. 6, to stop the travel in the Y-direction. The flip-flop 22 will remain in its operating state until the operating cycle is finished, as a result of which all subsequent motions in the Y-direction are determined only by the row spacing $\Delta Y$ which is preselected at the preselector unit 12. The output signal of the AND-gate 18 is also fed through the OR-gate 19 to the input of the monostable multivibrator 20- which resets the spacing counter 10 to zero.

After the motion in the Y-direction is stopped, the motion in the X-direction is started, and the AND-gates 15 and 17 are enabled by a logic "1" signal at the conditioning input 28 and the AND-gates 16 and 18 are disabled by a logic "0" signal at the conditioning input 29. On the other hand, however, the AND-gate 15 is disabled by the flip-flop 21 which is in its original state. As soon as the count of the spacing counter 10 is equal to the coordinate value $X_i$ preselected by the preselector unit 13, the output signal of the AND-gate 17 changes the flip-flop 21 into its operating state and, as a result, the AND-gate 17 is disabled and the AND-gate 15 enabled. The same output signal is fed through the OR-gate 23 to the output 34 for initiating the exposure process and further to the input of the column counter 24 which counts the first column. In addition, the spacing counter 10 is reset to zero through the OR-gate 19 and the monostable multivibrator 20. During the further motion in the X-direction only signals from AND-gate 15 reach the output 34, the input of the column counter 24 and the reset input of the spacing counter 10, which signals are produced in accordance with the column spacing preselected by the preselector unit 11.

After the maximum number of preselected columns has been counted by the column counter 24, the motion in the X-direction is reversed by signals at the output 32, that is, the reverse motion of the positioning device is initiated, and the flip-flop is changed back into its original state by signals supplied to the input 30. As soon as the initial row position is reached, the motion in the X-direction is stopped and the motion in the Y-direction is started. The motion in the Y-direction occurs until the row spacing preselected by the preselector unit 12 is reached. Then the motion in the Y-direction is stopped by signals from the output 35, the row counter 26 is advanced by one digit and the spacing counter 10 is reset to zero. In the manner described the motions in the X- and Y direction occur alternately in the X and Y directions until the maximum number of rows preselected at the row counter 26 is reached and the operating cycle is stopped by signals at the output 33. Before or at the beginning of each operating cycle the flip-flops 21 and 22 are set into their original states by signals supplied to the inputs 30 and 31.

If the preselector units 13 and/or 14 are set to the digit "zero," the corresponding flip-flops 21 and/or 22 are already changed at the beginning of the operating cycle into their operating states, thus, causing the preselector units 11 and/or 12 to act immediately.

What we claim is:

1. An electronic circuit arrangement for producing photomasks having repetitive patterns arranged in an orthogonal mask field defined by rows and columns with predetermined spacings between said rows and columns, said orthogonal mask field being displaced by definite initial coordinate values Xi, Yi relative to a fixed point, comprising:

a spacing counter (10) including input and output means, a column spacing preselector unit (11), a row spacing preselector unit (12), an Xi-coordinate preselector unit (13) and a Yi preselector unit (14), said preselector units having inputs connected to respective ones of said outputs means of the spacing counter (10), a number of AND-gates (15, 16, 17, 18) each having a number of input terminals, each of said preselector units having outputs connected to a respective one of said AND-gate input terminals for producing preselection signals, first and second control terminals (28, 29) connected to respective ones of said input terminals of said AND-gates for preparing a motion in the row direction and in the column direction, first and second bistable multivibrators (21, 22) each having a set and a reset input and two outputs, the output terminals of said bistable multivibrators being connected to respective ones of said AND-gate inputs, certain of said AND-gates being connected with their outputs to the set-input of a respective one of the bistable multivibrators; third and fourth control terminals (30, 31) connected to said reset inputs of the bistable multivibrators for resetting the bistable multivibrators to their respective starting position, a first OR-gate (19) having an output and a number of inputs corresponding to the number of said AND-gates, each of said inputs of said first OR-gate being connected to one of said AND-gate outputs, a monostable multivibrator (20) having an input and an output, said output of the first OR-gate (19) being connected to the input of said monostable multivibrator, the output of said monostable multivibrator being connected to the input means of said spacing counter (10) for resetting the spacing counter to zero count, second and third OR-gates (23, 25) for identifying column and row signals respectively, said second OR-gate (23) having an output (34) for producing a control signal and inputs the latter being connected to certain outputs of said AND-gates, said third OR-gate (25) having an output (35) for producing a further control signal and inputs the latter being connected to certain other outputs of said AND-gates, a column counter (24) and a row counter (26), said column counter having an input connected to the output (34) of the second OR-gate (23), said row counter having an input connected to the output (35) of the third OR-gate (25), said column and row counters having outputs (32, 33) for producing still further control signals.

2. The electronic circuit arrangement according to claim 1, wherein said preselector units (11, 12, 13, 14) comprise means for adjusting said preselector units to a predetermined count to produce an output signal when said count has been reached in response to the count of said spacing counter (10).

3. The electronic circuit arrangement according to claim 1, wherein said column counter (24) and said row counter (26) comprise means for resetting said column and row counter to a zero count.

4. In an optional projection method for producing photo masks having repetitive patterns arranged in an orthogonal mask field, wherein the orthogonal mask field is defined by rows and columns with predetermined spacing between the rows and columns, and wherein initial coordinates $x_i$ and $y_i$ are selectable independently with respect to the fixed coordinates of the orthogonal mask field, the improvement wherein said method comprises arranging a plurality of complex patterns on a photographic plate by a step-and-repeat process to form a single complex mask field consisting of complex patterns shifted with respect to each other, each complex pattern having dimensions greater than the dimensions of an available image field, and wherein the step of arranging each of said complex patterns on said plate comprises arranging a plurality of individual mask fields of different repeat structure on said plate by a step-and-repeat operation, each individual mask field having dimensions that are within the dimensions of said available image field.

5. In an optical projection method for producing photo masks having repetitive patterns arranged in an orthogonal mask field, wherein the orthogonal mask field is defined by rows and columns with predetermined spacing between the rows and columns, wherein initial coordinates $x_i$ and $y_i$ are selectable independently with respect to the fixed coordinates of the orthogonal mask field, wherein the complex patterns have any desired size larger than that of an available image field and include individual patterns, and wherein the individual patterns are complete as to their functional content and have outer dimensions smaller than said available image field; the improvement wherein said method comprises arranging a plurality of mask fields with different repeat patterns on a photographic plate, the mask fields being shifted with respect to each other, and assembling the shifted mask fields together to form a single complex mask field consisting of complex patterns, said step of assembling of said complete individual patterns into said complex patterns comprising sequentially assembling said complete individual patterns in a plurality of step-and-repeat operations, and preselecting different initial coordinates $x_i$ and $y_i$ for each first repetitive pattern of each step-and-repeat operation.

6. In an optical projection method for producing photo masks having repetitive patterns arranged in an orthogonal mask field, wherein the orthogonal mask field is defined by rows and columns with predetermined spacing between the rows and columns, wherein initial coordinates $x_i$ and $y_i$ are selectable independently with respect to the fixed coordinates of the orthogonal mask field, and wherein the complex patterns have dimensions larger than that of an available image field and include subpatterns, the improvement wherein said method comprises arranging a plurality of mask fields with different repeat patterns on a photographic plate, the mask fields being shifted with respect to each other, and assembling the shifted mask fields together to form a single complex mask field consisting of complex patterns, said method further comprising subdividing said complex patterns, which are complete as to their functional content, into different subpatterns which are incomplete as to their functional content and which have dimensions smaller than said image field, said step of subdividing taking into account the structural content of said subpatterns to adapt the outlines of said subpatterns to their structural content, and reassembling said subpatterns without any intervening gaps, said reassembling step comprising sequentially performing a plurality of step-and-repeat operations and preselecting different initial coordinates $x_i$ and $y_i$ for each first repetitive pattern of each step-and-repeat operation, whereby a complex photo mask field having repetitive patterns which comprise the complex pattern is produced.

* * * * *